United States Patent
Crozier et al.

(12) 
(10) Patent No.: US 6,460,161 B1
(45) Date of Patent: Oct. 1, 2002

(54) PROCESSING OF STATE HISTORIES IN VITERBI DECODING

(75) Inventors: Stewart N. Crozier, Groton, MA (US); Andrew Hunt, Ottawa (CA)

(73) Assignee: Her Majesty the Queen in right of Canada, as represented by the Minister of Industry through the Communications Research Centre (CA)

( * ) Notice: Subject to any disclaimer, the term of this patent is extended or adjusted under 35 U.S.C. 154(b) by 0 days.

(21) Appl. No.: 09/324,428

(22) Filed: Jun. 1, 1999

Related U.S. Application Data

(60) Provisional application No. 60/087,591, filed on Jun. 1, 1998.

(51) Int. Cl.$^7$ .............................................. H03M 13/41
(52) U.S. Cl. ...................................................... 714/795
(58) Field of Search ........................................ 714/795

(56) References Cited

U.S. PATENT DOCUMENTS

| | | | |
|---|---|---|---|
| 4,583,078 A | * 4/1986 | Shenoy et al. | 340/347 DD |
| 4,905,317 A | * 2/1990 | Suzuki et al. | 341/51 |
| 5,056,105 A | 10/1991 | Darmon et al. | 375/1 |
| 5,349,589 A | * 9/1994 | Chennakeshu et al. | 341/144 |
| 5,369,671 A | * 11/1994 | Yehushua et al. | 375/341 |
| 5,390,198 A | * 2/1995 | Higgins | 371/43 |
| 5,416,787 A | * 5/1995 | Kodama et al. | 371/43 |
| 5,446,747 A | 8/1995 | Berrou | 371/45 |
| 5,559,837 A | * 9/1996 | Blaker et al. | 375/341 |
| 5,719,875 A | 2/1998 | Wei | 371/2.1 |
| 5,742,621 A | 4/1998 | Amon et al. | 371/43 |
| 5,764,649 A | 6/1998 | Tong | 371/2.1 |
| 5,881,106 A | * 3/1999 | Cartier | 375/262 |
| 5,887,007 A | * 3/1999 | Iwata et al. | 371/43.7 |
| 5,887,036 A | * 3/1999 | Temerinac | 375/341 |

OTHER PUBLICATIONS

Gorski–Popiel, "A Viterbi Decoder for the SCAMP Terminal", MILCOM '92, 1992, pp. 1–16–1020.*

C. Berrou, A. Glavieux, and P. Thitmajshima; "Near Shannon Limit Error–Correcting Coding and Decoding Turbo–Codes"; The Proceedings of ICC 1993. Geneva, Switzerland, May 1993; pp 1064–1070.

G. Solomon and H. Tilborg, "A Connection Between Block and Convolutional Codes", SIAM J. Appl. Math, vol. 37, No. 2, pp. 358–369, Oct., 1979.

B. Solomon and H. Tilborg, "A Connection Between Block and Convolutional Codes", SIAM J. Appl. Math, vol. 37, No. 2, pp. 358–369, Oct., 1979.

H. Ma and J. Wolf, "On Tail Biting Convolutional Codes", IEEETrans. On Comm., vol. COM–34, No. 2, pp. 104–111, Feb. 1986.

C. Berrou and M. Jezequel, "Frame–Oriented Convolutional Turbo–Codes", Elec. Letters, vol. 32, No. 15, pp. 1362–1364, Jul. 1996.

(List continued on next page.)

*Primary Examiner*—Stephen M. Baker
(74) *Attorney, Agent, or Firm*—Polster, Lieder, Woodruff & Lucchesi

(57) ABSTRACT

A simplified method of history handling for the Viterbi decoding of convolutional codes is described herein. The state number, or one or more of the most-significant bits of the state number, is loaded into the corresponding state history. Each state number represents the sequence of data bits that, in convolutional encoding, would give rise to the corresponding state. The most recent data bit provides the least significant bit of the state number. This invention reduces the processing requirements associated with the handling of the history, and is especially useful for decoder implementations using general-purpose processors.

7 Claims, 4 Drawing Sheets

OTHER PUBLICATIONS

.H.H. Ma and V.K. Bhargava, "An Efficient Maximum Likliehood Decoding Algorithim for Generalized Tail Biting Convolutional Codes Including Quasi–Cyclic Codes", Corres. To IEEE Trans. On Comm., vol. 37, No. 8, pp. 875–879, Aug. 1989.

S. Benedetto, D. Divsalar, G. Montorsi and F. Pollara, "Parallel Concatenated Trellis Coded Modulation", ICC, 1996.

C. Berrou and A. Glavieux, "Turbo–Codes: General Principles and Applications", Proc of the $6^{th}$ Int. Tirrenia Workshop on Digital Communications, Pisa, Italy, pp. 215–226, Sep. 1993.

W.J. Blackert, E.K. Hall and S.G. Wilson, "Turbo Code Termination and Interleaver Conditions", Elec. Letters, vol. 31, No. 24, pp. 2082–2084, Nov. 23, 1995.

G. Caire and G. Lechner, "Turbo Codes with Unequal Error Protection", Elec. Letters, vol. 32, No. 7, pp. 629–631, Mar. 1996.

Y. Chang, "Parallel Decoding of Turbo Codes", Elec. Letters, Jun. 1996.

J–F Cheng, "Hyperimposed Convolutional Codes", ICC 1996 Dallas, TX, USA, pp. 979, Jun. 1996.

J–F Cheng and R.J. McEliece, "Unit–Memory Hamming Turbo Codes", Proc. of Int. Symp. On Information Theory, Whistler, BC, pp. 33, Sep. 1995.

R. V. Cox and C–E. W. Sundberg, "An Efficient Adaptive Circular Viterbi Algorithim for Decoding Generalized Tailbiting Convolutional Codes", IEEE Trans. On Vehic. Tech., vol. 43, No. 1, pp. 57–67, Feb. 1994.

J. Lodge, and R. Young, "Separable Concatenated Convolutional Codes with Iterative MAP Decoding for Rician Fading Channels", Proc. IMSC, 1993, Pasadena, CA, pp. 467–472, Jun. 1993.

J. H. Lodge, R.J. Young and P.S. Guinand, "Separable Concatenated Convolutional Codes: The Structure and Properties of a Class of Codes for Iterative Decoding", Proc. of the 5ht Annual Conf. On Wireless Communications, Calgary, Canada, pp. 703–712, Jul. 1993.

E. Lutz, D. Cygan, M. Dippold, F. Dolainsky and W. Papke, "The Land Mobile Satellite Communication Chaneel: Recording, Statistic and Channel Model", IEEE Trans. On Veic. Tech., vol. 40, No. 2, May 1991.

A.H.S. Mohammadi, A.K. Khandani, "Unequal Error Performance on Turbo–Encoder Output Bits", Elec. Letters.

L. Papke, and K. Fazel, "Combined Multilevel Turbo–Codes with BPSK Modulation", GlobCom 1995, Singapore, pp. 649, Nov. 1995.

S.S. Pietrobon, "Implementation and Performance of a Turbo/MAP Decorder for use in an Interactive Turbo Decoder", Proc. of Int. Symposium on Information Theory, Whistler, BC, pp. 78, Sep. 1995.

M.C. Reed amd S.S. Pietrobon, "Turbo–Coded Termination Schemes and a Novel Alternative for Short Frames", Proc. of PIMRC, 1996, Taipei, Taiwan, Oct. 1996.

R. Pydiah, A. Glavieux, A. Picart and S. Jacq, "Near Optimum Decoding of Product Codes", Proc. of GlobeCom 1994, San Francisco, CA, pp. 339–343, Nov. 1994.

P. Robertson, "Illuminating the Structure of Code and Decoder of Parallel Concatenated Recursive Systematic (Turbo) Codes", 1994 IEEE GlobeCom 1994, pp. 1298–1303, Nov.–Dec. 1994.

P. Robertson, "Improving Decoder and Code Structure of Parallel Concatenated Recursive Systematic (Turbo) Codes", Proc. of ICUPC 1994, San Diego, CA, pp. 183–187, 1994.

P. Robertson and T. Worz, "Coded Modulation scheme Employing Turbo Codes", Elec. Letters, vol. 31, No. 10, pp. 1546–1547, Aug. 1995.

P. Robertson and T. Worz, "A Novel Coded Modulation Scheme Employing Turbo Codes", URSI & ITG Conference, Kleinheubacher Tagung, Kleinheubach, Germany, Oct. 1995, pp. 1546–1547, Aug. 1995.

Y. V. Svirid and S. Reidel, "Interative ("Turbo") Decoding of Threshold Decodable Codes", European Transaction.

U. Wachsmann and J. Huber, "Power and Bandwidth Efficient Digital Communication Using Turbo–Codes in Multilevel Codes", European Transactions on Telecommunications, vol. 6, No. 5, pp. 557–567, Sep.–Oct. 1995.

H. Lou, "Implementing the Viterbi Algorithim", IEEE Signal Processing Magazine, pp. 42–52, Sep. 1995.

S. Benedetto, D. Divsalar, G. Montorsi and F. Pollara, "A Soft–Input APP Module for Iterative Decoding of Concatenated Codes"; IEEE Communications Letters, vol. 1, No. 1, Jan. 1997, pp. 22–26.

* cited by examiner

| State Number | Time i | Time i+1 | Time i+2 | Time i+3 | Time i+4 |
|---|---|---|---|---|---|
| 00 | mmm, hhhh | mmm, hhh0 | mmm, hh00 | mmm, h100 | mmm, 1100 |
| 01 | mmm, hhhh | mmm, hhh1 | mmm, hh01 | mmm, h001 | mmm, 1001 |
| 10 | mmm, hhhh | mmm, hhh0 | mmm, hh10 | mmm, h110 | mmm, 1110 |
| 11 | mmm, hhhh | mmm, hhh1 | mmm, hh11 | mmm, h111 | mmm, 0011 |

Table 1 (Prior Art)

| State Number | Time i | Time i+1 | Time i+2 |
|---|---|---|---|
| 00 | mmm, 00 | mmm, 10 | mmm, 11 |
| 01 | mmm, 01 | mmm, 00 | mmm, 10 |
| 10 | mmm, 10 | mmm, 11 | mmm, 11 |
| 11 | mmm, 11 | mmm, 11 | mmm, 00 |

Table 2

PROCESSING OF STATE HISTORIES IN VITERBI DECODING

This application claims benefit of Prov. No. 60/087,591, filed Jun. 1, 1998.

FIELD OF THE INVENTION

The invention generally relates to error-correction coding or more particularly, the invention relates to history handling for Viterbi decoding.

BACKGROUND

Viterbi decoding of convolutionally encoded messages is a common error-control method in the field of digital communications systems, and is well known in the art as described in U.S. Pat. No. 5,742,621, and Motorola Application Report APR40/D, revision 0, May 1998. Software based Viterbi decodes are commonly used in digital communication systems due to the availability of low cost, high performance digital signal processors (DSPs). In conventional software implementations the handling of the history, associated with the decoding path, amounts to a substantial potential of the Viterbi decoder processing time. It is common in the art to have a collection of history bits associated with each state, and a comparison/selection operation, which includes the setting of history bit, for each state, as a method of handling the history.

FIG. 1 depicts a common rate ½, constraint length K=7, binary convolutional encoder, using a shift register with K-1=6 memory elements. This encoder has $N=2^{K-1}=2^6=64$ states. For every input data bit, d(i) two coded bits, $c_1(i)$ and $c_2(i)$, are generated. The encoder is a state machine whose state is [d(i−(k−2)), . . . , d(i−1), d(i)] at time i, and has generator polynomials $g_1=[1011011]_2$ and $g_2=[1111001]_2$. The generator polynomials specify how delayed versions of the input are added up (modulo-2) to produce each output. Each binary digit (bit) of the generator polynomial corresponds to a tap on the shift register, or a tap on the input data bit. The output of the encoder is determined by the generator polynomials (as well as the state of the encoder and the input data bit), but the state transitions are independent of the polynomials, and depend only on the current state and the input data bit.

In the Viterbi algorithm (VA), both a state history $H_n(i)$ and a state metric $M_n(i)$ are associated with each state n, at time i. There is an associated branch metric $B_{nm}(i)$ for each valid transition from state m to state n. In the particular example where K=7, states 0 (000000) and 32 (100000) can both go to either state 0 (000000) or state 1 (000001), depending on the input data bit. No other state transitions from states 0 and 32 are possible. The state metrics and the state histories are updated as follows:

$$M_n(f)=\max/m[M_m(i-1)+B_{nm}(i)] \quad (1)$$

$$H_n(i)=[H_n(i-1), LSB(n)], \text{ m=best old state} \quad (2)$$

These two equations referred to as the add-compare-select (ACS) operation, and the application of the add-compare select operation to all states at a given time is considered as one Viterbi advance.

The application of one Viterbi advance is represented in FIG. 3. In this case the memory of the convolutional encoder is 2, and hence there are 4 states. In conventional software VA implementations, two buffers are required. Each buffer must be capable of holding a full set of state metrics and histories: one for the previous, or "old" data, and one for the updated, or "new" data. After new data is obtained the new data is used as the old data for a subsequent Viterbi advance.

In determining the new state history for a state, as in equation (2), the prior are method of history handling inserts the least significant bit of the state number of the new state into the state history. This is a critical aspect of prior art history handling, where a history bit has to be inserted each time a new history is generated.

History handling consumes a considerable portion of the processing resources in a typical Viterbi decoder implementation. There is, therefore, a need to reduce the complexity of the history handling to permit more practical and economical implementation of a Viterbi decoder.

SUMMARY OF THE INVENTION

An object of this invention is to provide an improved method of history handling for Viterbi decoders that reduces the processing time required to decode a convolutionally encoded message relative to conventional methods.

Therefore, in accordance with an aspect of the present invention, there is provided a method of processing the state histories within a Viterbi decoder, which receives a sequence of samples, representing a sequence of encoded data bits from a convolutional encoder having N states, and a memory size of K−1 bits, where $K \geq 2$, $N=2^{K-1}$, and each state is uniquely identified by a sequence of K−1 state bits, which corresponds to K−1 data bits entered into the encoder. The method provided by the invention comprises the following steps. The first step is to define an initial state metric and an initial state history for each state. The second step is, for each state, insert, into the initial state history, L contiguous state bits that correspond to the L data bits first entered into the encoder, where $1 \leq L \leq K-1$. The third step is to designate the initial state metrics and the initial state histories as previous state metrics and previous state histories respectively. The fourth step is to determine at least one branch metric, using no less than one of the samples received by the decoder. The fifth step in the process is to use the branch metric, or metrics, determined in the fourth step, to determine N new state metrics and N new state histories from the previous state metrics and the previous state histories, where each new state history is a copy of a previous state history. Upon reaching this point the decoding continues by repeating the fourth and fifth steps L−1 times, wherein the new state metrics and the new state histories become previous state metrics and the previous state histories, respectively, for subsequent repetitions of the fourth and fifth steps. Preferably L=K−1. In an embodiment of the invention, at least one bit of the state history is present in at least one bit of the least significant bits of a storage word storing the state metric.

In accordance with another aspect of the present invention there is provided a state history processor within a Viterbi decoder that receives and decodes a sequence of samples representing a sequence of encoded bits obtained from encoding a sequence of data bits with a convolutional encoder having N states and a memory size of K−1 bits, where $K \geq 2$, $N=2^{K-1}$, and each state is uniquely identified by a sequence of K−1 state bits corresponding to K−1 data bits entered into the encoder, the previously mentioned processing being comprised of five elements. The first element is a set of N first buffers corresponding to the N states, where each first buffer is used for storing a previous history and a previous metric. The second element is a set of N second buffers corresponding to the N states, where each second buffer is used for storing a new history and a new metric. The third element is a means for determining an initial state metric and an initial state, for each state, that is to be stored in the corresponding second buffer. The fourth element is a means for inserting into each new history L contiguous state bits that correspond to L data bits first entered into the encoder, where L is at least one and at most K−1. The fifth element is a means for performing L advances, with each advance consisting of the following steps. Firstly, the first and second buffers' designations are interchanged. Secondly, at least one branch metric is determined using at least one of the samples received by the decoder. Thirdly, N new state metrics and N new state histories are determined from the previous state metrics and the previous state histories, by using the at least one branch metric, wherein each new state history is a copy of one previous state history. Fourth, and finally, the N new state metrics and the N new state histories are stored in the N second buffers. An additional embodiment of this invention calls for a history processor, as previously described, wherein for each state at least one bit of the state history is present in at least one bit of the least significant bits of the state metric.

A significant advantage of this invention is the reduction in the computational complexity of the core of the Viterbi decoding algorithm. In the comparison of the present invention with the prior art approach of shifting each collection of history bits and then "OR-ing" in the new history bit, it becomes apparent that the present invention has a computational advantage. With the invention, there is no need either for the shift operation, or for the "OR" operation. Additionally in order to choose the "shift-and-OR" approach to history bit handling, with embedded history, it would be necessary to ensure that the shifting did not affect the state metrics themselves. This concern is not present with this invention because the technique of embedding the history bits into the least significant bits of the state merits work well.

Another advantage of the present invention relates to its operation on processors with word-widths less than or equal to 16 bits, also referred to as narrow word-width processors. Such processors, using conventional history handling methods, cannot feasibly embed the history bits in the least significant bits of the metric storage words, except for the case of very short constraint-lengths. This inadequacy is demonstrated by a K−7 convolutional code (i.e. memory-6). With conventional history handling methods, the low 6 bits of history simply reproduce the state number. This means that at least 10 bits of each state metric storage word would have to be allocated for the history bits, since, for both computational and memory efficiency reasons, it is undesirable to store the history bits more often than every 4 bits processed. Thus, if 10 bits are reserved for history, only 6 bits remain for the state metrics themselves. Since the state metrics require several more bits of quantization than the input samples feeding the Viterbi decoder, the quantization of the input would be very coarse, Thus, for narrow word-width processors, using conventional history handling methods, the history bits have to be read, selected, updated, and written, independently of the same metrics. This substantially increases the processing requirements associated with the core of the Viterbi decoder. In one embodiment of the present invention, only 4 least-significant bits are needed to store the history bits, leaving 12 bits for the state metrics themselves. With the present invention, up to a "memory" history bits can be present at once, but there is no requirement to use this maximum number. In summary, for processors with word-widths less than or equal to 16 bits, the present invention allows the use of the "embedded history" technique, which can result in a decoder throughput increase of approximately 50%.

BRIEF DESCRIPTION OF THE DRAWINGS

Exemplary embodiments of the invention will now be further described with references to the drawings, wherein.

Table 1 illustrates the conventional Viterbi Approach to storing histories whereby the LSB's of the state histories simply reproduce the state number;

Table 2 illustrates the method of pre-setting of 2 LSB's with the state at time i in accordance with an embodiment of this invention.

DESCRIPTION OF THE INVENTION

Figure 1:
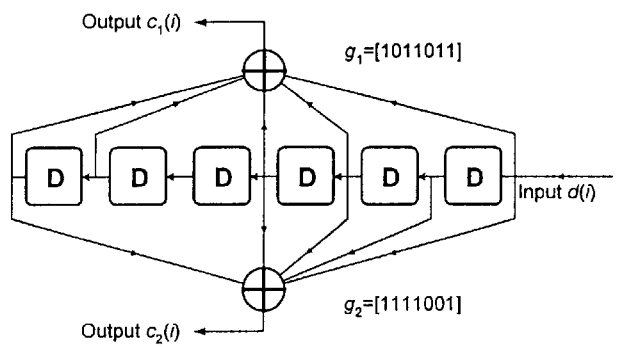
FIG. 1 illustrates a conventional rate ½ binary conventional encoder having constraint length K=7, as new bits enter on the right, the old bits are shifted left.
Figure 2:
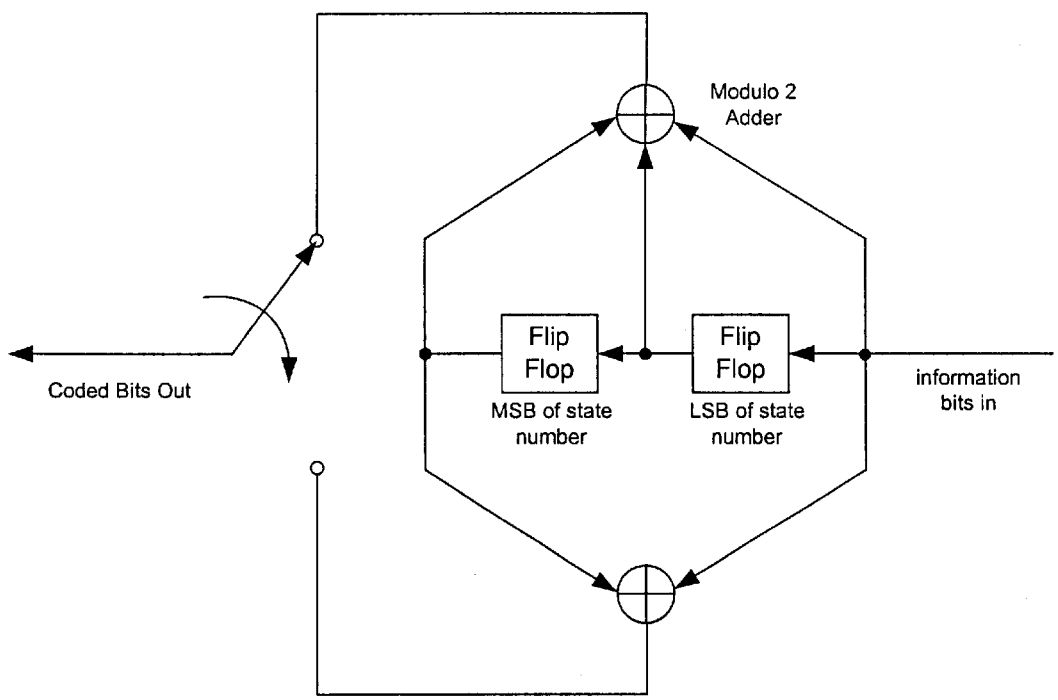
FIG. 2 illustrates a binary convolutional encoder having K=3 and generator polynomials $g_1=[111]_2$ for the top adder, and $g_2=[101]_2$ for the bottom adder.

FIG. 2 depicts an example of a conventional rate ½ convolutional encoder having 2 memory units (i.e. K=3) and 4 states (N=$2^{K-1}$). In this example, the top adder has a generator polynomial of $g_1=[111]_2$, while the bottom adder has a generator polynomial of $g_2=[101]_2$. Thus, differing parity bits are generated and transmitted which will allow the reconstruction of the original (raw) sequence of data bits by a Viterbi decoder. The encoder shown has 4 possible states defined by the two bits stored therein. In the state numbering convention used in this example the most significant bit is lost when a new data bit is input. This state-numbering convention is used while describing the present invention.

Table 1 shows set of state metrics and state histories in a conventional Viterbi decoder, while Table 2 shows sets of state metrics and state histories for an embodiment of the present invention. The state metrics are indicated as "mmm", and the state histories are shown is binary numbers.

With the conventional Viterbi decoding approach, as shown in Table 1, the least significant bits (LSB's) of the state histories simply store the same information as is inherent in the state number itself. In this case, the memory is 2, and so the two LSBs of the state histories reproduce the state number. At time i+4, the two underlined history bit positions indicate the sate at time i+2 for the path that gave rise to the metric of the state being considered.

An embodiment of the invention will now be described with reference to Table 2 and with respect to a memory-2 encoder. In this embodiment the two least significant bits are preset with the state number at time i. It is to be observed that at time i+2, the two least-significant history bits associated with each state indicate the state at time i for the path that gives rise to the metric of the state being considered. As the encoder has 4 states, the Viterbi decoder also has 4 states. The 4 states are numbered according to the data bit sequence in encoding that gives rise to the state. The numbering convention is that the bit first received (oldest) in the encoder is the most significant bit of the state number, and thus the most recently received (newest) bits is the least significant bit of the state number. The bits making up the state number are referred to as state bits. Further, the invention will be described, in particular, with reference to convolutional encoding applied in a "flushed block" manner, meaning that the encoder starts in the zero state, a finite number of data bits are fed through the encoder, and then "memory" zeros (in this case, 2 zeros) are fed into the encoder to return the encoder to the zero state.

Decoding begins by initializing the state metric for state 0 with a relatively large positive value, and initializing the state metrics for all of the other states with a relatively large negative value. The values are chosen so that state zero is guaranteed to "win" as the process of Viterbi decoding progresses. The state histories are initialized with the state numbers. This means that the state numbers are inserted into the state histories, which in this case require 2 bits each. For example in an embodiment where the history words are each 32 bits wide, the low 2 bits of each state history indicate the state number, after initialization, while the remaining 30 bits simply hold zero bits.

Figure 3:
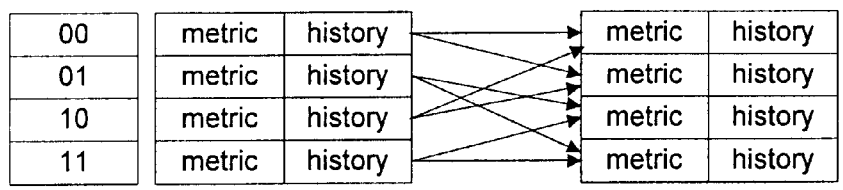
FIG. 3 illustrates the basic structure of a Viterbi decoder associated with the encoder of FIG. 2.

When Viterbi decoding begins, the first two received samples $S_0$ and $S_1$ are used to compute two branch metrics $B_{00}=S_0+S_1$ and $B_{01}=S_0-S_1$. Using the two computed branch metrics $B_{00}$ and $B_{01}$, the Viterbi decoder can now advance to a new set of state metrics and new set of state histories. Each new state metric and new state history is determined by two previous state metrics and corresponding state histories, as well as the two branch metrics $B_{00}$ and $B_{01}$, and a knowledge of the convolutional encoder which determines which branch metric to use for each branching connection, and whether the branch metric is added or subtracted. Which two previous states are connected to a given new state is a direct consequence of the nature of a convolutional encoder. In the convolutional encoder, as each new data bit enters the encoder, the bits already in the encoder are shifted along by one bit position, and the oldest bit is discarded. With the state numbering convention chosen, for this embodiment's memory=2 convolutional code being considered, the previous states 0 and 2 are connected to new state 0 and 1. The connections between previous states and new states is illustrated in FIG. 3, which shows that each new state is reachable by 2 previous states, and itself leads to two next states.

Figure 4:
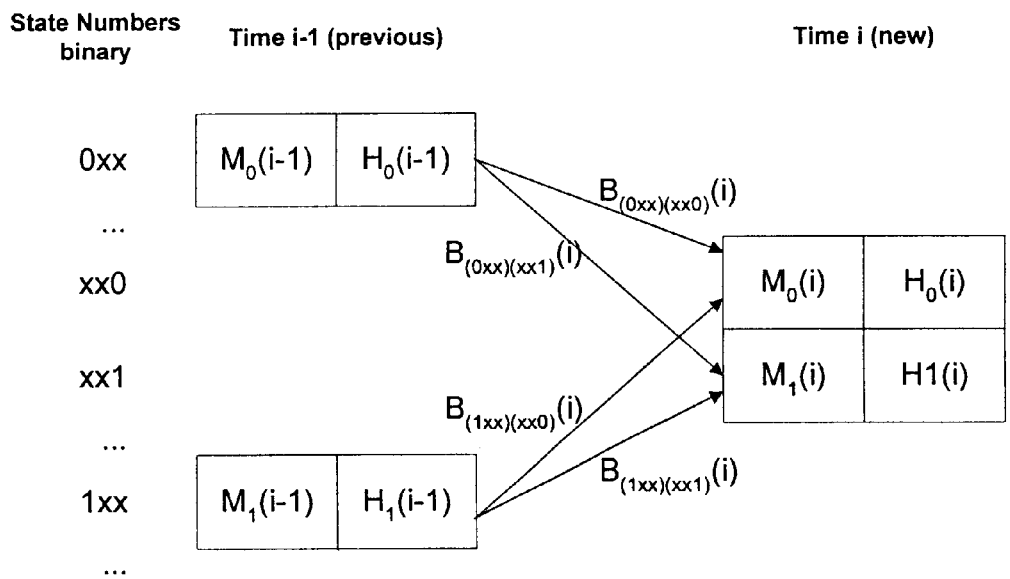
FIG. 4 illustrates the add-compare-select butterfly of a Viterbi decoder within the decoder of FIG. 3.

The pattern of connections is always such that two previous states with state numbers that differ only in their most significant bit are connected to the new states with state numbers that differ only in their least-significant bits. This pattern of two previous states connected to two new states forms the basis of the so-called "add-compare-select" butterfly operation that forms the core of the Viterbi decoding process. The connections of a single add-compare-select butterfly are shown in FIG. 4, which illustrates that the state metrics and state histories of states 0xx and 1xx are used in determining new state metrics and new state histories for states xx0 and xx1. The two previous states have state numbers differing only in their most-significant bits, and the two new states have state numbers differing only in their least-significant bits.

With the present invention the manipulations of the state histories that are performed as part of the basic add-compare-select operation are eliminated. The only history handling required of the add-compare-select butterfly operation is to select which of the two previous state histories should be copied to the new state history (which state history is copied depends on the outcome of the add-compare operation). Thus the prior art approach of equation (2), as given in the background, is replaced by equation (3) in the current invention.

$$H_n(i)=[H_m(i-1)], \; m=\text{best old state} \qquad (3)$$

Once new state metrics and new state histories have been determined, these then become previous state metrics and previous state histories for the next advance of the Viterbi decoder. Two new received samples are used to determine two new branch metrics, and add-compare-select operations are performed to determine another set of new state metrics and new state histories. This process is only repeated for a total of 2 times before some history handling operations are again performed. Two state bits were loaded initially, and so only 2 pairs of received samples are to be processed before the state bits are again inserted into the state histories.

To insert the state bits into the state histories, the state histories are first shifted left by two bits to make room for the new state bits, and then the 2 state bits forming each state number are inserted into the least-significant 2 bits of each state history.

Having inserted 2 state bits into each state history, the Viterbi decoder now advances by another set of 2 pairs of received samples, as described earlier. This process continues in a similar manner until the entire block of received samples has been processed.

We now describe how the decoder provides output bits based on state histories. Prior to inserting the state bits into the state histories, the decoder searches for the state metric having the largest value (i.e. the most likely state) and outputs the 2 most-significant bits of the corresponding state history. These bits will be lost in the shift process that precedes the insertion process. At the beginning of the Viterbi decoding there are some redundant output bits, and the decoder keeps track of how many bits should be discarded. Once the entire block has been processed, the decoder outputs the bits of the state history of the known ending state (state zero), beginning with the most-significant bit. Depending on how the length of the block relates to the period-2 insertion process, there may be redundant bits output at the very end of the block.

The above describes as embodiment of the present invention in conjunction with a relatively simple Viterbi decoding process in order to illustrate the invention, which is the loading of state bits into state histories in order to eliminate all conventional history handling processes except the copying in the add-compare-select butterfly operations. In alternate embodiments, the history for each state is not stored as one long word, but portions of the state histories are stored periodically, and the output of the decoder is determined by performing a "re-trace" operation through a matrix of stored partial history words.

Further, alternative embodiments make use of available techniques that do not require the state histories to be shifting in connection with the periodic state bit inserting operation.

Yet another embodiment makes use of an optimization technique specific to certain types of available processor platforms which is to insert the state bits into the least significant bits of the words storing the state metrics themselves. In such an embodiment, the appropriate history bits are selected automatically when the add-compare-select operation selects which state metric (plus or minus a branch metric) to store as the new state metric, thereby removing the need to separately select and copy the state history.

Figure 5:
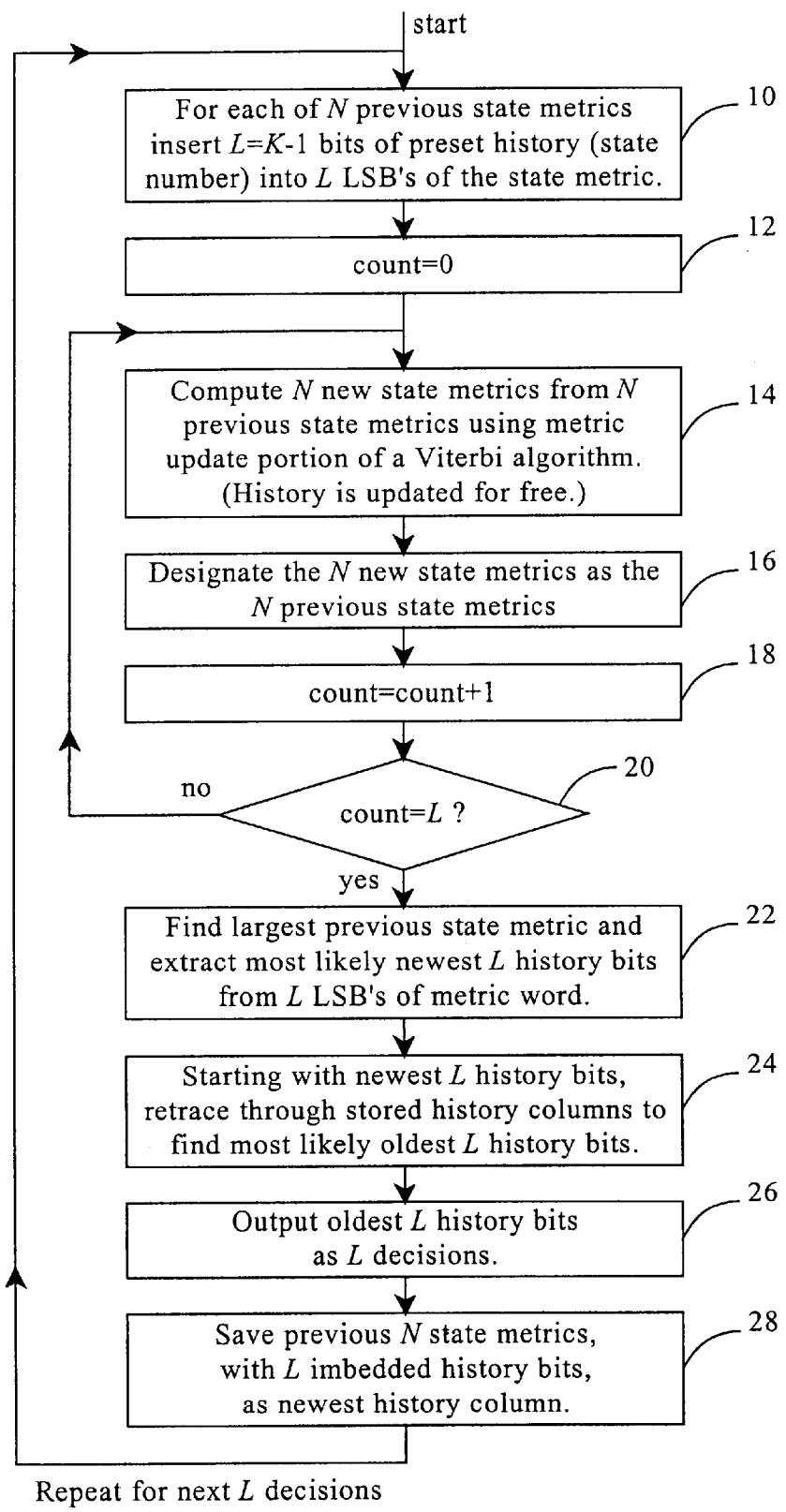
FIG. 5 illustrates, in a flow diagram, a method of Viterbi decoding where L=K−1 preset history bits are imbedded in the least significant bits (LSB's) of each state metric, and bit decisions are output L at a time, in accordance with an embodiment of the invention.

FIG. 5 illustrates, in a flow diagram, a method of Viterbi decoding, in accordance with an embodiment of this invention, where L=K−1 preset history bits are imbedded in the least significant bit (LSB's) of each state metric, and bit decisions are output L at a time. The starting previous state metrics are initialized as described previously. The first step 10 is to insert L=K-1 preset history bits into each of the previous state metrics. This is accomplished for each of the N previous state metrics by inserting L=K-1 bits of a state number into the L LSB's of each corresponding state metric. The branch metrics do not use their L LSB's. The second step, 12, is to initialize a counter. The third step, 14, is to compute N new state metrics from the N previous state metrics using a portion of a Viterbi algorithm that determines the state metrics, as described previously. The history update is inherent in the selection of the winning state metric; hence, history update requires a processing. The fourth step, 16, is to designate the N new state metrics as the N previous state metrics. The fifth step, 18, is to increment the counter. The sixth step, 20, is to test the counter to see if it is equal to L. If no then repeat the previous three steps. If yes then proceed to step 22. The sixth step, 22, is to find a largest previous state metric and extract the most likely newest L history bits from the L LSB's of the metric word. The seventh step, 24, is to retrace through the stored history columns, starting with the L newest history bits, to find L most likely oldest history bit d. The eighth step, 26, is to output the L oldest history bits as L bit decisions. The ninth step, 28, is to save the N previous state metrics, with L imbedded history bits, as the newest history column. This process is then repeated to obtain the next L decisions. In an alternative embodiment, an arbitrary previous state metric is used for the sixth step, 22, with a small degradation in performance.

Of course, numerous variations and adaptations may be made to the particular embodiments of the invention described above, without departing from the spirit and scope of the invention, which is defined in the claims.

What is claimed is:

1. A method of processing state histories within a Viterbi decoder that receives and decodes a sequence of samples representing a sequence of encoded bits obtained from encoding a sequence of data bits with a convolutional encoder having N states and a memory size of K-1 bits, where:

K is at least two, $N=2^{K-1}$, and each state is uniquely identified by a sequence of K-1 state b its corresponding to K-1 data bits entered into the encoder, said processing method comprising the steps of:

(a) for each state, determining an initial state metric and an initial state history;

(b) for each state, inserting into the initial state history L contiguous state bits that correspond to L data bits first entered into the encoder, where L is at least one and at most K-1;

(c) designating the initial state metrics and the initial state histories as previous state metrics and previous state histories, respectively;

(d) performing L advances, each advance using at least one branch metric, the branch metric determined using at least one of the samples received by the decoder, to determine N new state metrics and N new state histories from the previous state metrics and the previous state histories where each new state history is a copy of one previous state history.

2. A method of processing state histories as in claim 1, wherein L=K-1.

3. A method of processing state histories as in claim 1, wherein for each state at least one bit of the state history is present in at least one bit of the least significant bits of the state metric.

4. The method of processing state histories as in claim 1, wherein the L advances are performed consecutively, and $L \leq 1$.

5. A state history processor within a Viterbi decoder that receives and decodes a sequence of samples representing a sequence of encoded bits obtained from encoding a sequence of data bits with a convolutional encoder having N states and a memory size of K-1 bits, where:

K is at least two, $N=2^{K-1}$, and each state is uniquely identified by a sequence of K-1 state bits corresponding to K-1 data bits entered into the encoder, said processor comprising:

(a) a set of N buffers designated as first buffers corresponding to the N states, each first buffer for storing a previous history and a previous metric;

(b) a set of N buffers designated second buffers corresponding to the N states, each second buffer for storing a new history and a new metric;

(c) means for determining, for each state, an initial state metric and an initial state history to be stored in a corresponding second buffer;

(d) means for inserting into each new history L contiguous state bits that correspond to L data bits first entered into the encoder, where L is at least one and at most K-1;

(e) means for performing L advances, wherein in each advance:

i) the first and second buffers' designations are interchanged;

ii) at least one branch metric is determined using at least one of the samples received by the decoder;

iii) N new state metrics and N new state histories are determined from the previous state metrics and the previous state histories, by using the at least one branch metric, wherein each new state history is a copy of one previous state history;

iv) the N new state metrics and N new state histories are stored in the N second buffers.

6. A state history as in claim 5, wherein L=K-1.

7. A state history processor as in claim 5, wherein for each state at least one bit of the state history is present in at least one bit of the least significant bits of the state metric.

* * * * *

UNITED STATES PATENT AND TRADEMARK OFFICE
CERTIFICATE OF CORRECTION

PATENT NO. : 6,460,161 B1
DATED : October 1, 2002
INVENTOR(S) : Stewart N. Crozier and Andrew Hunt It is certified that error appears in the above-identified patent and that said Letters Patent is hereby corrected as shown below:

Column 7,
Line 47, after the word "state", it reads "b its", it should read -- bits --;

Column 8,
Line 15, after the word "and", it reads "L $\leqq$ 1", it should read -- L>1 --;

Line 53, after the word "history", and before the word "as", please insert the word -- processor --.

Signed and Sealed this

First Day of April, 2003

JAMES E. ROGAN
*Director of the United States Patent and Trademark Office*